(12) United States Patent
Hoentschel et al.

(10) Patent No.: US 7,354,836 B2
(45) Date of Patent: Apr. 8, 2008

(54) TECHNIQUE FOR FORMING A STRAINED TRANSISTOR BY A LATE AMORPHIZATION AND DISPOSABLE SPACERS

(75) Inventors: Jan Hoentschel, Dresden (DE); Andy Wei, Dresden (DE); Gert Burbach, Dresden (DE); Peter Javorka, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 27 days.

(21) Appl. No.: 11/550,941

(22) Filed: Oct. 19, 2006

(65) Prior Publication Data
US 2007/0202653 A1    Aug. 30, 2007

(30) Foreign Application Priority Data
Feb. 28, 2006   (DE) ............... 10 2006 009 272

(51) Int. Cl.
*H01L 21/336* (2006.01)
(52) U.S. Cl. .............. 438/301; 438/199; 438/530; 257/E21.632
(58) Field of Classification Search ........ 257/E21.051, 257/E21.057, E21.4, E21.473, E21.615
See application file for complete search history.

(56) References Cited

U.S. PATENT DOCUMENTS

| | | | |
|---|---|---|---|
| 6,984,564 B1 * | 1/2006 | Huang et al. | 438/275 |
| 7,279,758 B1 * | 10/2007 | Li et al. | 257/408 |
| 2005/0285187 A1 | 12/2005 | Bryant et al. | 257/335 |

FOREIGN PATENT DOCUMENTS

DE     10260613     7/2004

OTHER PUBLICATIONS

German office action dated Nov. 6, 2006.

* cited by examiner

*Primary Examiner*—Michael Lebentritt
*Assistant Examiner*—Cheung Lee
(74) *Attorney, Agent, or Firm*—Williams, Morgan & Amerson, P.C.

(57) ABSTRACT

By using a disposable spacer approach for forming drain and source regions prior to an amorphization process for re-crystallizing a semiconductor region in the presence of a stressed spacer layer, possibly in combination with enhanced anneal techniques, such as laser and flash anneal processes, a more efficient strain-generating mechanism may be provided. Furthermore, the spacer for forming the metal silicide may be provided with reduced width, thereby positioning the respective metal silicide regions more closely to the channel region. Consequently, an overall enhanced performance may be obtained on the basis of the above-described techniques.

19 Claims, 6 Drawing Sheets

TECHNIQUE FOR FORMING A STRAINED TRANSISTOR BY A LATE AMORPHIZATION AND DISPOSABLE SPACERS

BACKGROUND OF THE INVENTION

1. Field of the Invention

Generally, the present invention relates to the formation of integrated circuits, and, more particularly, to the formation of transistors having strained channel regions by using stress-inducing sources, such as embedded strain layers and the like, so as to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed close to the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, the conductivity of the channel region is a dominant factor in determining the performance of MOS transistors. Thus, the reduction of the channel length, and associated therewith the reduction of the channel resistivity, renders the channel length an important design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions in order to provide low sheet and contact resistivity in combination with a desired channel controllability. In addition, the vertical location of the PN junctions with respect to the gate insulation layer also represents a critical design criterion in view of leakage current control, since reducing the channel length may usually also require reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, providing increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node, while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow for forming the germanium or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like, are used in an attempt to create a desired strain within the channel region. Although a promising approach, the process of creating the strain in the channel region by applying a specified external stress may depend on the efficiency of the stress transfer mechanism for the external stress provided by, for instance, contact layers, spacers and the like into the channel region to create the desired strain therein. Hence, although providing significant advantages in terms of process complexity over the above-discussed approach requiring additional stress layers within the channel region, the efficiency of the stress transfer mechanism may depend on the process and device specifics and may result in a reduced performance gain for one type of transistor.

In another approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked and subsequently the silicon/germanium layer is selectively formed in the PMOS transistor by epitaxial growth. Although this technique offers significant advantages in view of performance gain of the PMOS transistor and thus of the entire CMOS device, an appropriate design may have to be used that balances the difference in performance gain of the PMOS transistor and the NMOS transistor.

In still a further approach, a substantially amorphized region is formed adjacent to the gate electrode by ion implantation and the amorphized region is then re-crystallized in the presence of a stress layer formed above the transistor area, as will be described in more detail with reference to FIGS. 1a-1c.

Figure 1A:
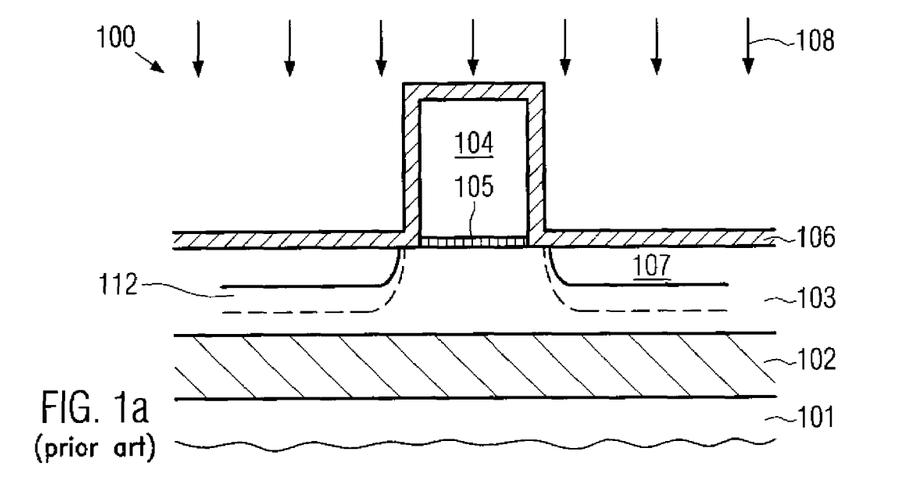
FIGS. 1a-1c schematically illustrate a conventional transistor element during various manufacturing stages in forming a strained channel region on the basis of a re-crystallization process with a stressed overlying layer resulting in a moderate strain in the channel region according to conventional techniques.

FIG. 1a schematically shows a semiconductor device 100 comprising a substrate 101, such as a silicon substrate having formed thereon a buried insulating layer 102, above which is formed a crystalline silicon layer 103. Moreover, the semiconductor device 100 comprises a gate electrode 104 formed above the silicon layer 103 and separated therefrom by a gate insulation layer 105. Moreover, a liner 106, for instance, comprised of silicon dioxide, is conformally formed on the gate electrode 104 and the silicon layer 103. The semiconductor device 100 is exposed to an ion implantation process 108 which may be designed such that a region 112 of the silicon layer 103 located adjacent to the gate electrode 104 is substantially amorphized. Furthermore, a doped region 107 may be formed within the layer 103 and may comprise any appropriate doping species that is required for the specific transistor to be formed by means of the gate electrode 104.

A typical process flow for forming the semiconductor device 100 may comprise the following processes. After forming or providing the substrate 101 having formed thereon the buried insulating layer 102 and the silicon layer 103, appropriate implantation sequences may be performed to establish a desired vertical dopant profile within the layer 103, which for convenience is not shown in FIG. 1a. Thereafter, any appropriate isolation structures (not shown), such as shallow trench isolations or the like may be formed. Next, an appropriate dielectric material may be formed by deposition and/or oxidation followed by the deposition of an appropriate gate electrode material, wherein both layers may then be patterned on the basis of sophisticated photolithography and etch techniques. Subsequently, the liner 106 may be formed on the basis of well-established plasma enhanced chemical vapor deposition (PECVD) techniques, wherein, depending on the process requirements and strategy, the liner 106 may act as an offset spacer for the formation of the doped region 107 on the basis of well-established implantation techniques. Furthermore, prior to or after the formation of the doped region 107, which may comprise a P-type dopant or an N-type dopant, depending on whether a P-channel transistor or an N-channel transistor is to be formed, an amorphization implantation process 108 may be performed. For this purpose, an appropriate dose and energy for an implant species under consideration may be selected on the basis of well-established recipes, thereby forming the substantially amorphized regions 112. For example, xenon, germanium and other heavy ions are suitable candidates for the amorphization implantation 108. Thereafter, a spacer layer may be formed above the semiconductor device 100 in such a way that the corresponding spacer layer may exhibit a specified type of intrinsic stress, such as tensile or compressive stress, wherein, after the deposition of the layer or after a subsequent patterning of the spacer layer into respective sidewall spacers on the basis of anisotropic etch techniques, an anneal process may be performed in order to re-crystallize the substantially amorphized regions 112.

Figure 1B:
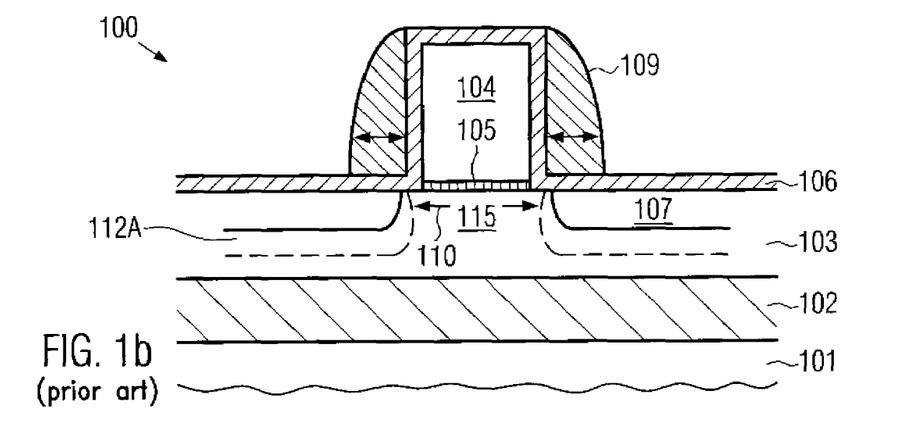

FIG. 1b schematically shows the semiconductor device 100 after the completion of the above-described process sequence, in which a sidewall spacer 109 having a high intrinsic stress, in the present example indicated as a tensile stress, is formed on sidewalls of the gate electrode 104, while the substantially amorphized regions 112 are substantially re-crystallized and are now indicated as 112A. Due to the presence of the highly stressed spacer layer or the spacer 109, the re-crystallized regions 112A are re-grown in a strained state, thereby also creating a respective strain 110 in a channel region 115 located below the gate electrode 104. Thereafter, the semiconductor device 100 may be subjected to further manufacturing processes for providing a transistor element having the strained channel region 115.

Figure 1C:
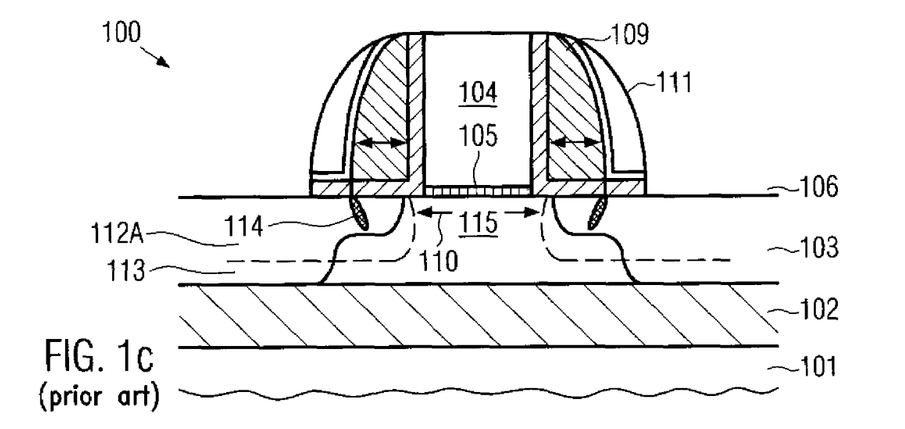

FIG. 1c schematically shows the semiconductor device 100 with an additional spacer element 111 formed adjacent to the spacer 109 and with respective drain and source regions 113 formed within the silicon layer 103 and also partially within the strained re-crystallized region 112A. The device 100 may be formed in accordance with well-established processes, such as further implantation sequences, on the basis of the spacer element 111 in order to obtain the required dopant profile for the drain and source regions 113.

Consequently, an efficient technique for the creation of the strain 110 within the channel region 115 is provided which may lead to a significant enhancement in the charge carrier mobility and, thus, in the conductivity of the device 100. During the operation of the device 100, however, a significant increase in leakage current may be observed, which is believed to be caused by crystalline defects 114, which may also be referred to as "zipper defects," and which may represent a source of reducing the minority charge carrier lifetime, thereby possibly significantly contributing to an increase of leakage current.

Although the approach described with respect to FIGS. 1a-1c provides the potential of a significant performance gain for N-channel transistors and P-channel transistors, there is still room for improvement, for instance in enhancing the strain transfer, reducing the leakage currents and the like.

In view of the situation described above, a need exists for an improved technique for the formation of transistor elements with a strained channel region, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of a transistor element with a highly strained channel region by forming a substantially amorphized region and re-crystallizing the substantially amorphized region on the basis of an overlying stressed layer. Furthermore, the drive current capability may be even more enhanced by positioning an overlaying contact etch stop layer having a specific intrinsic stress more closely to the channel region by using a specifically designed spacer element for a previous silicidation process, which may have a significantly less width compared to a previously used spacer element for forming drain and source regions, thereby also positioning the metal silicide region more closely to the channel region. Moreover, in some illustrative embodiments, the amorphization process may be performed after the formation of deep drain and source regions, thereby providing an enhanced re-crystallization process for enhancing the strain-inducing mechanism and reducing the risk of the creation of crystal defects.

According to one illustrative embodiment of the present invention, a method comprises forming a first doped region in a substantially crystalline semiconductor layer adjacent to a gate electrode having formed on sidewalls thereof a first sidewall spacer structure. Furthermore, the first sidewall spacer structure is removed and a substantially amorphized region is formed in the semiconductor layer and the first doped region. A stressed layer having a specified intrinsic stress is formed at least above a portion of the semiconductor layer and the substantially amorphized region is re-crystallized in the presence of the stressed layer by performing a heat treatment.

According to another illustrative embodiment of the present invention, a method comprises forming a first P-doped region adjacent to a first gate electrode and a first N-doped region adjacent to a second gate electrode, wherein the first and second gate electrodes are located above a semiconductor layer and have formed on sidewalls thereof a first spacer structure. The method further comprises substantially amorphizing at least a portion of the semiconductor layer and removing the first spacer structure from the first and second gate electrodes. Moreover, a stressed layer having a first type of intrinsic stress is formed above at least a portion of the first P-doped region and a stressed layer having a second type of intrinsic stress is formed above at least a portion of the first N-doped region, wherein the first type of intrinsic stress differs from the second type. Finally, the semiconductor layer is heat treated so as to substantially re-crystallize the substantially amorphized portion.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to improvements of a manufacturing technique in which a strained channel region may be accomplished on the basis of the re-crystallization of a previously amorphized semiconductor region on the basis of an overlying stressed layer, such as a spacer layer. For this purpose, deep drain and source regions may be formed on the basis of a sidewall spacer structure having appropriate dimensions so as to allow the formation of an appropriate lateral and vertical dopant profile, wherein subsequently the re-crystallization process may be performed after the removal of the spacer structure on the basis of a second spacer layer having a high intrinsic stress, wherein a thickness of the spacer layer may be designed for a second spacer structure that may serve as an appropriate silicidation mask for a subsequent formation of metal silicides in the re-crystallized semiconductor regions, thereby positioning the metal silicide more closely to a channel region. Furthermore, in illustrative embodiments, the process of substantially amorphizing the semiconductor region may be performed after the creation of deep drain and source regions, thereby allowing the amorphization of increased volumes within the semiconductor material. Consequently, during the subsequent re-crystallization, an enhanced strain generation is achieved in the channel region, wherein the probability for creating crystalline defects, as may occur in the conventional technique, may also be reduced. Moreover, prior to the amorphization, any implanted dopant species, as may be used for the formation of deep drain and source regions, buffer implantation regions, extension regions and a halo region, may be effectively activated by appropriate anneal techniques, such as flash anneal techniques and laser anneal processes, thereby providing enhanced dopant profiles due to the reduced thermal budget of the corresponding anneal techniques. Consequently, an overall gain in performance may be achieved, since the more efficient strain-inducing mechanism provided by the present invention offers an increased charge carrier mobility, while a reduced distance of metal silicide regions from the channel region may provide reduced series resistance, thereby also effectively contributing to the overall performance gain. Furthermore, the techniques according to the present invention may be effectively applied to transistors of different conductivity types, which may result in an enhanced flexibility of designing P-channel transistors and N-channel transistors, wherein the performance gain may be individually adjusted while expensive epitaxial growth techniques, as may also be used for generating strain in channel regions, may be omitted.

Figure 2A:
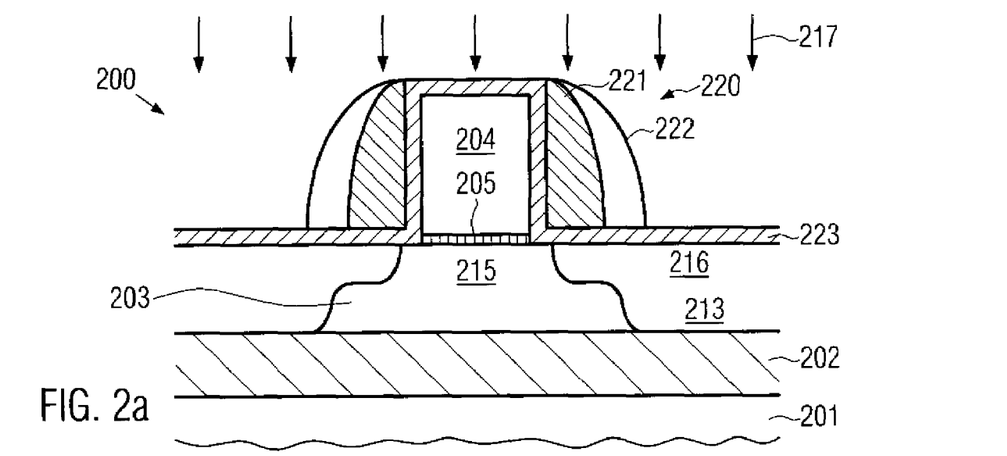
FIGS. 2a-2e schematically illustrate cross-sectional views of a transistor element during various manufacturing stages according to illustrative embodiments of the present invention.

With reference to FIGS. 2a-2h, further illustrative embodiments of the present invention will now be described in more detail. FIG. 2a schematically illustrates a semiconductor device 200, which may represent a field effect transistor of a specific conductivity type, such as a P-channel transistor or an N-channel transistor, formed above a substrate 201, which may be provided in the form of any appropriate carrier material, such as a bulk silicon substrate, a silicon-on-insulator (SOI) substrate and the like. Moreover, a semiconductor layer 203, such as a silicon-based layer, may be formed above the substrate 201, wherein it should be appreciated that the semiconductor layer 203 may be formed on a buried insulating layer (not shown) when an SOI architecture is considered. In other illustrative embodiments, the semiconductor layer 203 may represent an uppermost portion of a bulk semiconductor material. It should be understood that a silicon-based semiconductor material is to be understood as any crystalline semiconductor material comprising a significant amount of silicon, for instance more than approximately 50 atomic percent silicon.

The semiconductor device 200 may further comprise a gate electrode 204, which may be formed of any appropriate material, such as polysilicon and the like, wherein the gate electrode 204 may be separated from a channel region 215 formed in the semiconductor layer 203 by a gate insulation layer 205. For instance, for highly sophisticated semiconductor devices, a gate length, i.e., in FIG. 2a the horizontal extension of the gate electrode 204, may be in the range of 100 nm and significantly less, or even 50 nm and less. Consequently, the gate insulation layer 205, which may be formed of silicon dioxide, silicon nitride, a combination thereof or any other appropriate dielectric materials, may have a thickness of one to several nanometers. On sidewalls of the gate electrode 204 there is provided a first sidewall spacer structure 220, which may comprise one or more individual spacer elements, such as spacers 221 and 222. Furthermore, at least one liner 223 may be formed to separate the individual spacers 221 and 222 from the gate electrode 204 and the semiconductor layer 203. The spacer structure 220 may be formed of any appropriate material, such as silicon nitride, silicon oxide and the like, while the liner 223 may be formed of a material having a high etch selectivity with respect to the material of the spacer structure 220. In one illustrative embodiment, the one or more individual spacer elements 221 and 222 may be formed so as to be in direct contact with each other, thereby avoiding the formation of an intermediate liner. However, in other illustrative embodiments, the spacers 221 and 222 may be separated by a respective liner, for instance when the initially formed liner 223 may not provide sufficient etch controllability during the formation of the second spacer element 222.

Furthermore, in this manufacturing stage, the device 200 may comprise a first doped region 213 within the semiconductor layer 203, wherein, in some illustrative embodiments, the doped region 213 may be formed on the basis of a respective implantation process 217, wherein the size and shape of the doped region may depend on the specifics of the spacer structure 222, acting as an implantation mask, and the parameters of the implantation process 217. In one illustrative embodiment, the first doped region 213 may represent the deep drain and source region, which may also include a so-called buffer implantation region 216, depending on the requirements with respect to the lateral profile of the dopant concentration in the layer 203 for forming a respective transistor element. It should be appreciated, however, that any other lateral profiling of the dopant concentration in accordance with device requirements may be used.

A typical process flow for forming the semiconductor device 200 as shown in FIG. 2a may comprise the following processes. After forming or providing the semiconductor layer 203 above the substrate 201, which may be accomplished by epitaxial growth techniques and/or advanced wafer bond techniques when SOI architectures and the like are considered, respective isolation structures (not shown), which may enclose individual transistor elements or groups of transistors, may be formed on the basis of well-established recipes, such as techniques for forming shallow trench isolations. Thereafter, any required implantation processes may be performed to provide a vertical dopant profile (not shown) within the semiconductor layer 203. Thereafter, an insulating layer may be formed by deposition and/or oxidation with an appropriate thickness corresponding to the thickness of the gate insulation layer 205. Next, an appropriate gate electrode material may be deposited, for instance on the basis of low pressure chemical vapor deposition (LPCVD) techniques, when a polycrystalline material, doped or undoped, may be used as the gate electrode material. Thereafter, the gate electrode material and the insulating layer may be patterned on the basis of sophisticated lithography and etch techniques using established recipes.

Thereafter, the liner 223 may be formed, for instance as a silicon dioxide liner, a silicon nitride liner and the like, depending on the process strategy for forming the spacer structure 220. For example, when the spacer structure 220 is to be formed on the basis of silicon nitride, the liner 223 may be formed as a silicon dioxide material, since selective anisotropic etch techniques for silicon nitride and silicon dioxide are well-established in the art. Conversely, if the spacer structure 220 may be substantially formed of silicon dioxide, the liner 223 may be provided in the form of a silicon nitride material. The deposition of the liner 223 may be performed on the basis of well-established PECVD techniques, wherein a thickness of the liner 223 is not critical and may be selected on the basis of other process criteria, such as sufficient protection during one or more subsequent etch processes, offset distance for performing a subsequent implantation sequence to form extension regions and/or halo regions and the like.

After the conformal deposition of the liner 223, a spacer layer may be deposited and may be subsequently anisotropically etched, wherein the liner 223 may have the desired etch selectivity to protect the gate electrode 204 and the semiconductor layer 203, as is well-known in the art. In one illustrative embodiment, the spacer layer may be deposited with a thickness that substantially corresponds to a width of the spacer 221, which may then be used as a first implantation mask for a first implantation step of the implantation process 217, thereby introducing a dopant species for forming the buffer implantation region 216. Thereafter, a second spacer layer may be deposited with a specified thickness, wherein, in some illustrative embodiments and as shown in FIG. 2a, the second spacer layer may be formed directly on the first spacer 221, and may be subsequently anisotropically etched using the liner 223 for controlling the etch process. Thereafter, a second step of the implantation process 217 may be performed to position the dopant species in accordance with design requirements for forming the deep drain and source regions 213. It should be appreciated that the first sidewall spacer structure 220 may be comprised of a single spacer element or more than two spacer elements, depending on the requirements with respect to the lateral profile of the region 213.

After the ion implantation process 217, in one illustrative embodiment, the first doped region 213, including the buffer implantation region 216, if provided, may be activated by advanced anneal techniques, such as laser-based or flash-based anneal processes. A flash anneal process comprises the exposure of the device 200 to one or more short bursts of radiation including a plurality of different wavelengths, possibly in combination with a pre-heating process, thereby heating the irradiated portion of the device 200 to high temperatures in order to activate, i.e., position, the dopant species at lattice sites. Typically, during a flash-based anneal process, the device 200 may be irradiated from the front side, wherein, after irradiating the device 200, heat may be dissipated via the substrate 201. Since the corresponding radiation is provided in short time intervals, such as 0.1 to several microseconds, an efficient dopant activation may take place, without a substantial dopant diffusion. Similarly, in a laser-based anneal process, an appropriate laser beam with a specified wavelength may be provided in order to activate the dopants similarly as in the flash anneal process. In both regimes, the device 200 may be preheated to a specific temperature, such as approximately 600-700° C. and thereafter the actual short activation process may be initiated by exposure to short radiation pulses. Consequently, the implanted profile of the doped regions 213 and 216 may be substantially maintained during the activation process, due to the reduced diffusion activity compared to other anneal techniques, such as liquid epitaxial growth, furnace based techniques and the like. In other illustrative embodiments, the activation of the dopants in the regions 213 and 216 may be performed at a later stage, as will be described later on.

After the implantation 217 and after any anneal processes, the first spacer structure 220 may be removed on the basis of selective wet and/or dry etch processes. For instance, when the first spacer structure 220 is substantially comprised of silicon nitride, a wet chemical etch process on the basis of hot phosphoric acid may be used to remove silicon nitride selectively to silicon dioxide of the liner 223. In other illustrative embodiments, the spacer structure 220 may be removed on the basis of selective dry etch techniques, such as are used for the formation of the spacer elements 221 and 222, which may be advantageous when the spacer structure 220 is to be selectively removed from specific device portions, while it should be maintained, at least partially, in other device regions, which may be accomplished on the basis of corresponding resist masks and the like.

Figure 2B:
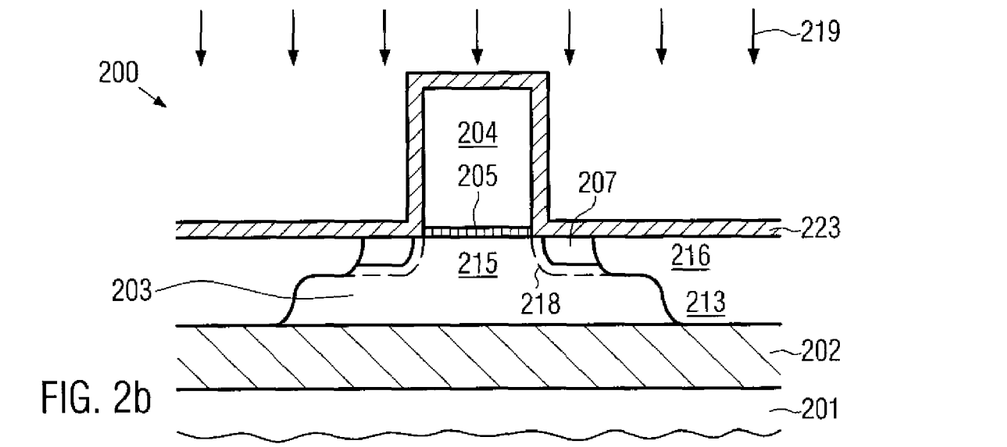

FIG. 2b schematically illustrates the semiconductor device 200 after the removal of the spacer structure 220 during a further ion implantation process 219. The process 219 may be designed such that an extension region 207 is formed as a second doped region adjacent to the first doped region comprised, in the example shown, of the regions 213 and 216. Furthermore, the implantation process 219 may include a process step for introducing a different dopant species compared to the dopants used for the extension region 207 and the regions 216 and 213 in order to form a so-called halo region 218 so as to increase therein the corresponding concentration of a dopant species initially provided in the layer 203. Consequently, by forming the halo region 218, a more pronounced PN junction may be obtained between the adjacent extension region 207 and the increased concentration in the halo region 218. In order to provide a desired shape of the halo region 218, the implantation process 219 may include a tilted implantation step on the basis of well-established recipes. It should also be appreciated that the implantation process 219 may be performed on the basis of the liner 223, when the corresponding thickness thereof has been appropriately selected to create the desired offset to the gate electrode 204. Moreover, the liner 223 may be etched anisotropically prior to the implantation process 219, when the corresponding screening effect may not be deemed appropriate for the implantation process 219. In other illustrative embodiments, the liner 223 may be removed after the removal of the spacer structure 220 and may be replaced by a different liner material or a correspondingly designed sidewall spacer (not shown) for the gate electrode 204 having a thickness as required for the implantation 219. After the implantation 219, in some illustrative embodiments, a corresponding anneal process may be performed in order to activate the dopants in the regions 207 and 218, thereby forming a respective pronounced PN junction. As previously explained, during such an anneal process, the regions 213 and 216 may also be activated, when a previous anneal process has not been carried out. For a corresponding anneal process for the dopants introduced by the implantation, in some illustrative embodiments, laser or flash anneal techniques may be used.

Figure 2C:
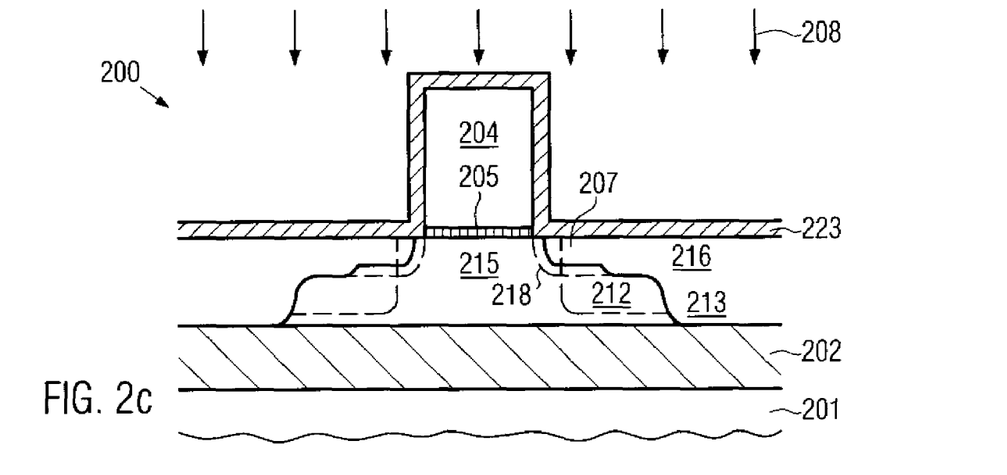

FIG. 2c schematically illustrates the semiconductor device 200 in a further advanced manufacturing stage wherein the device 200 is subjected to a further implantation process 208 for forming a substantially amorphized region 212 within the semiconductor layer 203 and also within doped regions 213, 216 and 207. The implantation 208 may be performed on the basis of heavy ions, such as xenon, germanium and the like, thereby creating high crystalline damage at a moderately low implantation dose. For instance, a dose of approximately $1 \times 10^{15}$ to $1 \times 10^{16}$ ions/cm$^2$ may be appropriate for creating a high degree of amorphization in the region 212 on the basis of appropriately selected implantation energies. It should be appreciated that appropriate process parameters for the implantation 208 may be readily established on the basis of simulation models, experiments and the like. Since at least the regions 213 and 216 have been appropriately activated prior to the implantation process 208, the region 212 may, in some illustrative embodiments, be formed to substantially amorphize the regions 213 and 216 in their entirety. In other embodiments, the depth of the region 212 may be selected according to other aspects, such as maintaining a certain portion of crystalline material to also initiate the re-growth process on the basis of the remaining material, wherein, however, a significantly enlarged region may typically be amorphized compared to conventional techniques, in which the amorphization implantation is performed prior to the formation of the deep drain and source regions.

In other illustrative embodiments, the order of the implantation processes 219 and 208 may be reversed so as to first form the amorphized region 212 and subsequently form the extension region 207 and the halo region 218, thereby reducing any channeling effects during the implantation 219.

Figure 2D:
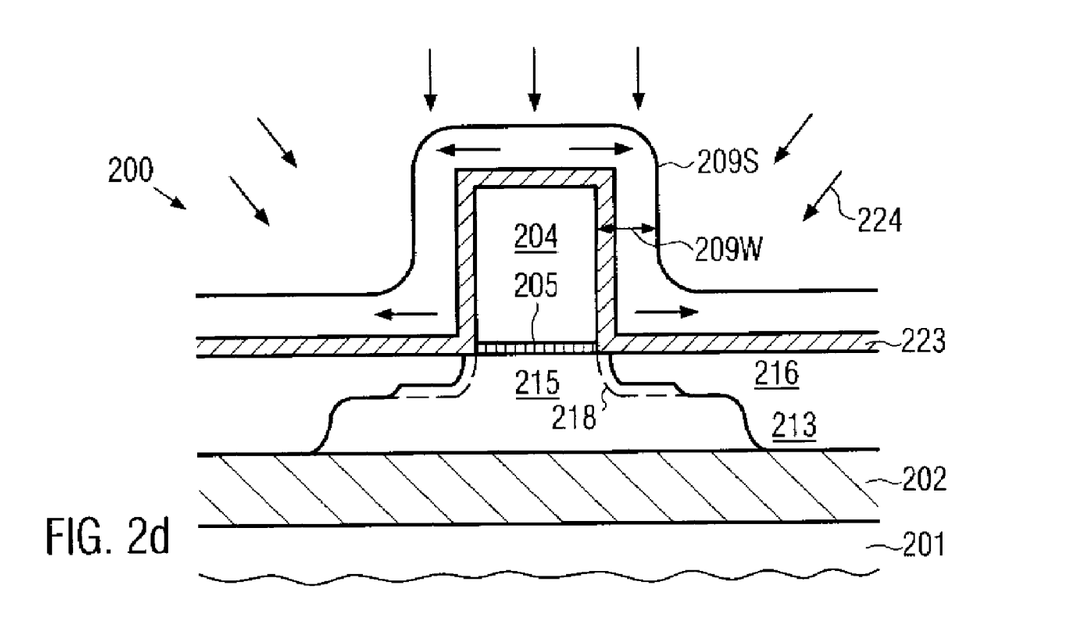

FIG. 2d schematically illustrates the semiconductor device 200 in a further advanced manufacturing stage. Here, the device 200 comprises a stressed spacer layer 209S, which may be comprised of any appropriate material that exhibits a specific high tensile or compressive stress, depending on the type of strain to be induced in the channel region 215. For example, as illustrated, the stressed spacer layer 209S may comprise a high tensile stress, which may generate a respective tensile strain in the channel region 215. Moreover, a thickness of the spacer layer 209S is selected in view of a desired spacer width of a spacer to be formed from the spacer layer 209S in a later stage, wherein the corresponding spacer width provides the desired offset with respect to a subsequent silicidation process, as will be described later on in more detail. Consequently, a thickness or width of the spacer layer 209S, indicated as 209W, may be less than a width of the first spacer structure 220 and may also be less than a width of the first spacer 221, which may for instance be required for the formation of a corresponding lateral dopant profile for the buffer region 216. Consequently, the width 209W may be selected independently from any requirements concerning the lateral dopant profile of the regions 207, 216 and 213. The spacer layer 209S may be formed on the basis of well-established recipes, such as PECVD techniques, in which process parameters may be selected such that the required intrinsic stress may be created during the deposition of the layer 209S. For instance, appropriate process recipes for silicon nitride are well established, in which process parameters such as the temperature, the pressure, the degree of ion bombardment, the ratio of precursor materials and the like may be controlled in order to obtain a high tensile or compressive stress on the order of magnitude of up to 1.5 GPa (Giga Pascal) or even higher. Thereafter, the device 200 may be subjected to a heat treatment 224 designed to substantially re-crystallize the amorphized region 212, wherein, in some embodiments, when the extension region 207 and the halo region 218 may have been formed after the amorphization implantation 208, during this treatment 224, the respective dopants may also be activated.

Due to the presence of the stressed spacer layer 209S, the re-crystallization produces a substantially strained semiconductor material within the substantially amorphized region 212, since the channel region 215, which may partially act as a crystal template, may be strained, thereby also inducing a strained re-growth of the amorphized portion. Moreover, the stress of the spacer layer 209S covering the semiconductor layer 203 may also provide a respective stress into the region 212 so that the re-crystallization may result in a correspondingly distorted crystal lattice, thereby also promoting the re-growth of a strained semiconductor material in the region 212. Thereafter, the spacer layer 209S may be anisotropically etched in order to form a respective spacer element, wherein well-established etch techniques may be used, similarly as are employed for the formation of the first spacer structure 220. Due to the resulting highly stressed spacers, a significant amount of strain may still be "conserved" in the re-grown portion 212.

Figure 2E:
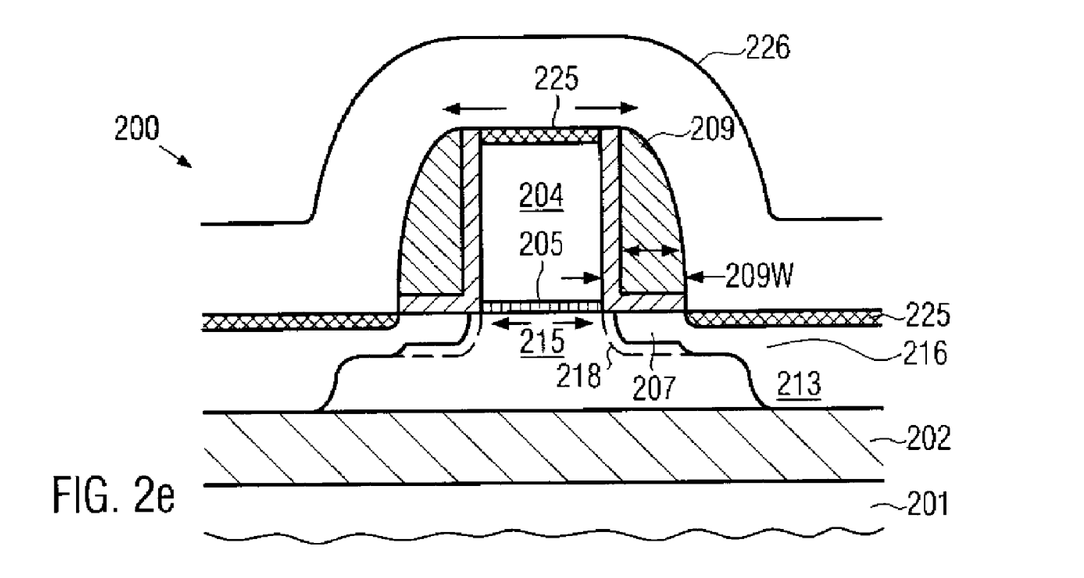

FIG. 2e schematically illustrates the device 200 in a further advanced manufacturing stage. As shown, the device comprises a second sidewall spacer structure 209 formed from the spacer layer 209S and metal silicide regions 225 formed within the extension regions 207 and the gate electrode 204. Moreover, a stressed layer, such as a contact etch stop layer 226, may be formed above the gate electrode 204 and the drain and source regions 213 including the extensions 207. In some illustrative embodiments, the contact etch stop layer 226 may be formed directly on the respective metal silicide regions 225, while in other embodiments an additional liner (not shown) may be provided between the layer 226 and the respective metal silicide regions 225.

The device 200 as shown in FIG. 2e may be formed according to the following processes. After the formation of the spacer 209 on the basis of process techniques as are previously described, a corresponding silicidation process may be performed, wherein the spacer 209 acts as a silicidation mask. That is, during the formation of the metal silicide regions 225, which may include the deposition of one or more appropriate refractory metals, such as cobalt, nickel, platinum and the like, or combinations thereof, and a subsequent heat treatment for initiating a chemical reaction, the formation of a metal silicon compound on the spacers 209 is substantially prevented. Due to the reduced width 209W compared to conventional techniques, in which the spacer 209 has a width so as to provide the required lateral dopant profile of the buffer region 216, a reduced offset of the respective metal silicide regions 225 from the channel region 215 is accomplished, while nevertheless a high degree of process reliability with respect to any shortages between the silicide 225 in the gate electrode 204 and the silicide 225 in the drain and source regions 213 may be provided.

Thereafter, the layer 226, possibly in combination with a preceding deposition of a liner material, may be formed on the basis of well-established recipes, wherein a desired high degree of stress may be created during the deposition, similarly as is explained with reference to the spacer layer 209S. Also in this respect, the reduced width 209W may provide enhanced strain in the channel region 215, since the layer 226 may apply its stress in a more direct fashion, since a reduced amount of material is provided between the channel region 215 and the layer 226. Consequently, an even enhanced stress transfer mechanism is provided, which may further increase the amount of strain obtained in the channel region 215. As a consequence, the overall performance of the device 200 is significantly increased compared to conventional techniques, since a reduced offset, determined by the reduced spacer width 209W, in combination with an enhanced stress and strain transfer into the channel region 215, may provide significantly enhanced drive current capability of the device 200. Moreover, the strained re-growth of the substantially amorphized region 212 (FIG. 2c), having an increased volume compared to conventional techniques, may reduce the formation of any crystal defects, such as the previously described zipper defects, thereby also reducing the risk for leakage current increase as well as strain relaxation. Furthermore, in some illustrative embodiments, the laser or flash anneal processes may be efficiently used, thereby also providing a more pronounced, i.e., more graded, dopant profile of the regions 207, 216, 213 and 218, which may also contribute to a performance gain. It should be appreciated that the device 200 may represent a P-channel transistor or an N-channel transistor, wherein the respective stressed spacer layer 209S and the layer 226 may be selected with appropriate intrinsic stresses, such as a tensile stress for an N-channel transistor or a compressive stress for a P-channel transistor.

Figure 2F:
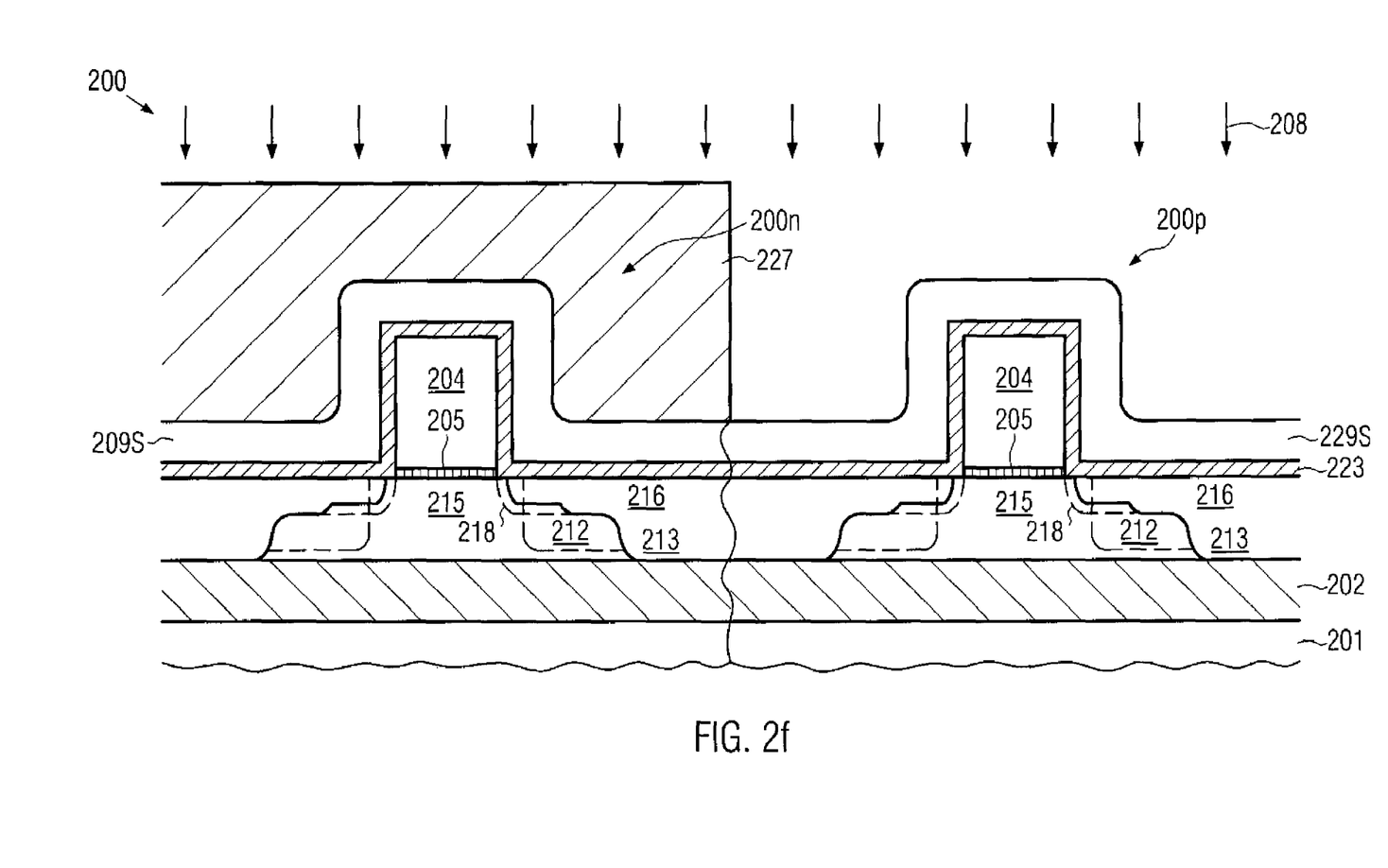
FIGS. 2f-2h schematically illustrate cross-sectional views of transistor elements of different conductivity type during various manufacturing stages in accordance with still other illustrative embodiments of the present invention.
Figure 2G:
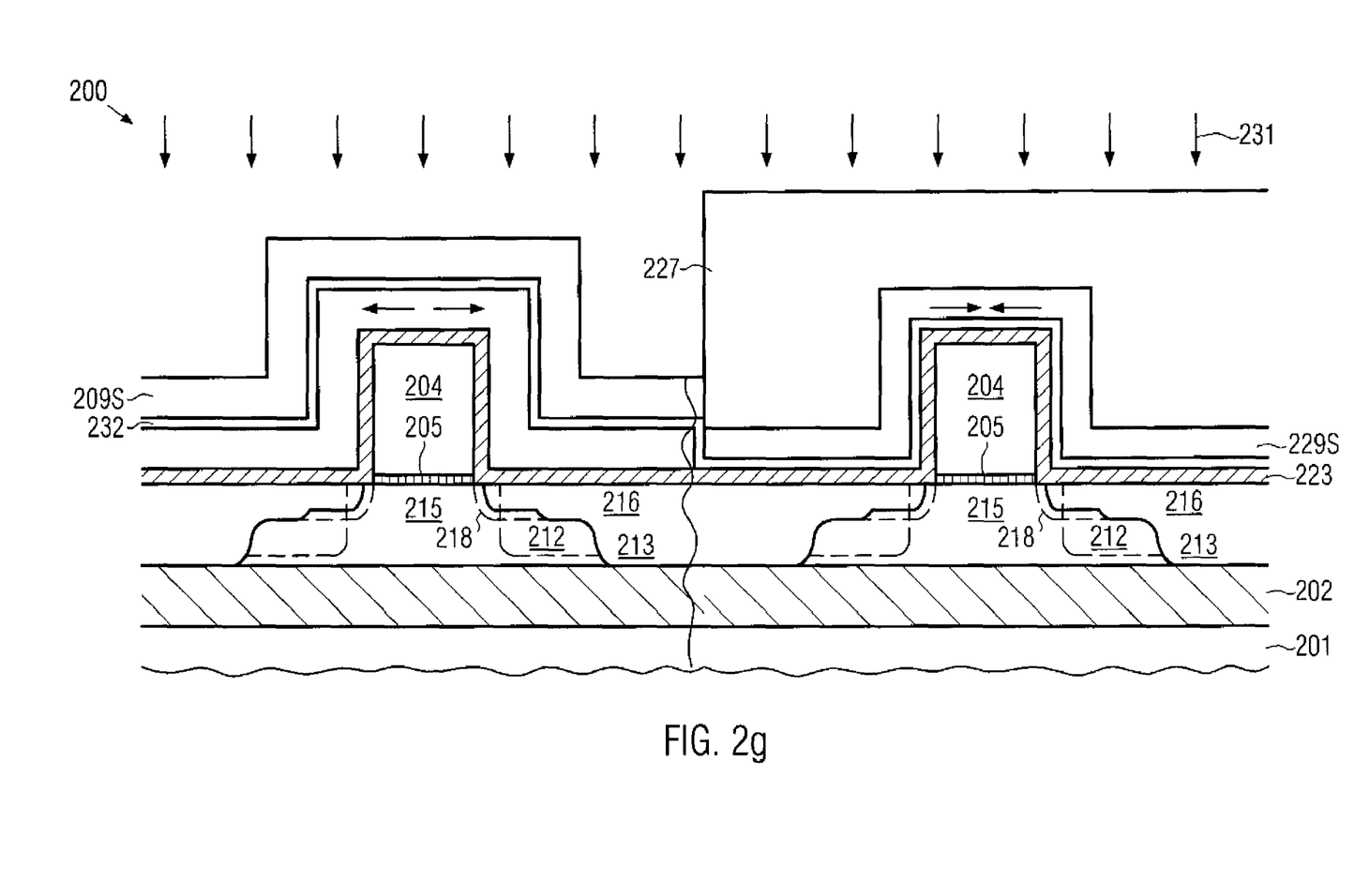
Figure 2H:
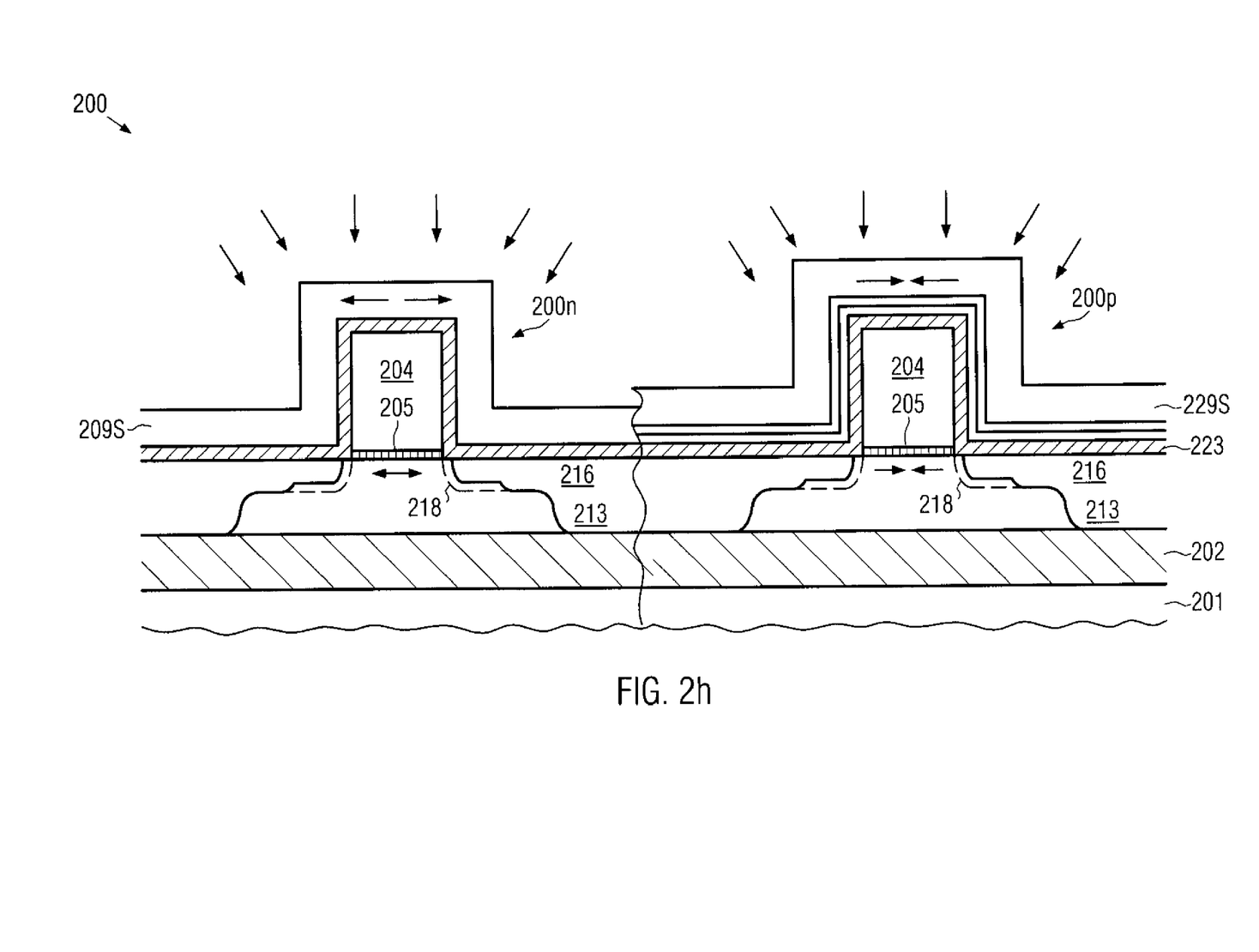

With reference to FIGS. 2f-2h, further illustrative embodiments of the present invention will now be described in more detail, in which transistors of two different conductivity types may receive a respective different strain in the corresponding channel regions.

FIG. 2f schematically illustrates the semiconductor device 200, which may now comprise a first transistor element 200n and a second transistor element 200p. The transistors 200n and 200p, which may represent an N-channel transistor and a P-channel transistor, respectively, are illustrated in a manufacturing stage that substantially corresponds to the manufacturing stage of the device 200 as shown in FIG. 2c. Thus, the transistors 200n, 200p may have formed thereon the spacer layer 209S having a respective intrinsic stress, such as a tensile stress, which may induce a corresponding tensile strain in the respective channel region 215 of the transistor 200n. Moreover, the first and second transistors 200n, 200p may still comprise the substantially amorphized regions 212. Additionally, the device 200 may comprise in this manufacturing stage a mask 227, such as a resist mask, which may be used during an etch process 228, such as a dry etch process, for protecting the first transistor 200n while exposing the second transistor 200p. During the etch process 228, the exposed portion of the spacer layer 209S may be removed, for instance on the basis of well-established selective anisotropic etch techniques, wherein the liner 223 may substantially avoid any damage in the second transistor 200p during the prolonged etch process 228.

FIG. 2g schematically illustrates the device 200 in a further advanced manufacturing stage. Here, a second spacer layer 229S may be formed above the first and second transistors 200n, 200p after the removal of the exposed portion of the first spacer layer 209S from the second transistor 200p. Moreover, an additional liner 232 may be provided between the second spacer layer 229S and the first spacer layer 209S of the first transistor 200n, and on the remaining liner 223 in the second transistor 200p. The liner 232 may have a high degree of etch selectivity with respect to the material of the spacer layer 229S. For example, the second spacer layer 229S may be formed of silicon nitride having a high intrinsic stress appropriate for creating the desired type of strain in the channel region 215 of the second transistor 200p, and thus, in the example shown, the spacer layer 229S may exhibit a high degree of compressive stress. Moreover, a further etch mask 230, such as a resist mask, may be provided to protect the second transistor 200p during a further etch process 231 for removing an unwanted portion of the second spacer layer 229S from the first transistor element 200n. Regarding any processes for forming the second spacer layer 229S, the same criteria apply as previously described with reference to the spacer layer 209S. During the etch process 231, the additional liner 232 may prevent damage on the lower-lying first spacer layer 209S. Thereafter, the exposed portion of the liner 232 may then be selectively removed on the basis of well-established recipes.

FIG. 2h schematically illustrates the semiconductor device 200 during a heat treatment for re-crystallizing the substantially amorphized portions 212 on the basis of two differently stressed spacer layers, i.e., the layer 209S on the first transistor 200n and the spacer layer 229S formed above the second transistor 200p. Consequently, in both transistors, a respective strain is generated in the corresponding channel regions with high efficiency, as is previously explained with respect to the device 200 as shown in FIG. 2d. Thereafter, further processing may be continued in the same way as is previously described with reference to FIG. 2e. Consequently, the advantages of a reduced series resistance and an increased strain generation may also be obtained for the first and second transistors 200n, 200p while at the same time a high degree of flexibility is offered for individually adapting the respective transistor characteristics. To this end, the magnitude and type of stress of the respective spacer layers 209S and 229S may be adjusted in order to result in the desired degree of strain within the respective channel region. Moreover, the thickness of the spacer layers 209S and 229S, as well as the material composition thereof, may be individually selected in view of transistor specific requirements, thereby additionally contributing to enhanced design flexibility.

As a result, the present invention provides a technique that enables the formation of strained transistor elements, in which drain and source regions are formed on the basis of a first spacer structure, while the silicidation process may be performed based on a spacer of reduced thickness so as to reduce the series resistance. Furthermore, the amorphization process for forming a substantially amorphized region may be performed after the formation of the drain and source regions on the basis of a stressed spacer layer or a portion thereof, thereby providing a high volume of re-grown material that may take on a specific type of strain during the re-growth process. Furthermore, since sophisticated anneal techniques, such as laser anneal and flash anneal, may be used for activating the dopants in the drain and source regions and/or the extension regions and the halo regions, a pronounced lateral dopant profile may be obtained, thereby also significantly contributing to an increased current drive capability. Moreover, the amorphization process may be performed after the formation of the respective drain and source regions, thereby providing the potential for re-growing a large volume of the semiconductor material, which may contribute to a more effective strain generation in the channel region and also reduce the probability of defect generation.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first doped region in a substantially crystalline semiconductor layer adjacent to a gate electrode having formed on sidewalls thereof a first sidewall spacer structure;
removing said first sidewall spacer structure;
forming a substantially amorphized region in said semiconductor layer and said first doped region;
forming a stressed layer having a specified intrinsic stress at least above a portion of said semiconductor layer; and
re-crystallizing said substantially amorphized region in the presence of said stressed layer by performing a heat treatment.

2. The method of claim 1, wherein forming said first doped region comprises performing at least one ion implantation process and annealing said semiconductor layer prior to removing said first sidewall spacer structure.

3. The method of claim 1, wherein forming said first doped region comprises performing at least one ion implantation process and annealing said semiconductor layer after removing said first sidewall spacer structure.

4. The method of claim 1, wherein forming said first doped region comprises forming a first spacer of said first sidewall spacer structure and performing a first implantation process, forming a second spacer adjacent to said first spacer and performing a second ion implantation process.

5. The method of claim 4, wherein said first and second spacers are formed in direct contact with each other.

6. The method of claim 1, further comprising forming a second doped region after removing said first sidewall spacer structure and prior to re-crystallizing said substantially amorphized region.

7. The method of claim 6, further comprising annealing said semiconductor layer to activate at least dopants in said second doped region prior to re-crystallizing said substantially amorphized region.

8. The method of claim 7, wherein annealing said semiconductor layer is performed by at least one of a laser anneal process and a flash anneal process.

9. The method of claim 1, further comprising forming a second sidewall spacer structure from said stressed layer, said second sidewall spacer structure having a reduced width compared to said first sidewall spacer structure.

10. The method of claim 9, further comprising forming a metal silicide at least in said second doped region on the basis of said second sidewall spacer structure.

11. The method of claim 10, further comprising forming a stressed layer above said gate electrode and said first and second doped regions to create strain in a channel region formed adjacent to said second doped region.

12. A method, comprising:
forming a first P-doped region adjacent to a first gate electrode and a first N-doped region adjacent to a second gate electrode, said first and second gate electrodes located above a semiconductor layer and having formed on sidewalls thereof a first spacer structure;
substantially amorphizing at least a portion of said semiconductor layer;
removing said first spacer structure from said first and second gate electrodes;
forming a stressed layer having a first type of intrinsic stress above at least a portion of said first P-doped region;
forming a stressed layer having a second type of intrinsic stress above at least a portion of said first N-doped region, said first type of intrinsic stress differing from said second type; and
heat treating said semiconductor layer to substantially re-crystallize said substantially amorphized portion.

13. The method of claim 12, wherein said substantially amorphized portion is substantially amorphized after removing said first spacer structure.

14. The method of claim 13, further comprising annealing said first P-doped and N-doped regions prior to removing said first spacer structure.

15. The method of claim 14, wherein annealing said first P-doped region and said first N-doped region comprises performing at least one of a laser anneal process and a flash anneal process.

16. The method of claim 11, further comprising forming a second P-doped region and a second N-doped region adjacent to said first P-doped and N-doped regions, respectively, after removing said first spacer structure.

17. The method of claim 16, further comprising annealing said second P-doped and N-doped regions prior to substantially re-crystallizing said substantially amorphized portion.

18. The method of claim 17, wherein annealing said second P-doped region and said second N-doped region comprises performing at least one of a laser anneal process and a flash anneal process.

19. The method of claim 12, wherein said first type of intrinsic stress is compressive stress and said second type of intrinsic stress is a tensile stress.

* * * * *